US011621721B1

United States Patent
Hagerty et al.

(10) Patent No.: US 11,621,721 B1
(45) Date of Patent: Apr. 4, 2023

(54) OPTIMIZED, AUTOMATIC IMPEDANCE-MATCHING SYSTEM

(71) Applicant: The United States of America as represented by the Secretary of the Navy, Newport, RI (US)

(72) Inventors: James D Hagerty, Tiverton, RI (US); Gabriel A Rodriguez-Rivera, Coventry, RI (US)

(73) Assignee: The United States of America as Represented by the Secretary of the Navy

( * ) Notice: Subject to any disclaimer, the term of this patent is extended or adjusted under 35 U.S.C. 154(b) by 0 days.

(21) Appl. No.: 17/512,939

(22) Filed: Oct. 28, 2021

(51) Int. Cl.
    *H03M 1/12*     (2006.01)
    *H03M 1/46*     (2006.01)
    *H03M 1/00*     (2006.01)

(52) U.S. Cl.
CPC ........... *H03M 1/466* (2013.01); *H03M 1/002* (2013.01); *H03M 1/462* (2013.01)

(58) Field of Classification Search
CPC ... G05F 1/70; G05F 3/02; G05F 1/625; G05F 1/10; G05F 1/455; H03M 3/458; H03M 1/466; H03M 1/60; H03M 3/368; H03M 1/124; H03M 3/356
USPC ......... 323/207–211, 299–303; 341/118–120, 341/172
See application file for complete search history.

(56) References Cited

U.S. PATENT DOCUMENTS

| | | | | |
|---|---|---|---|---|
| 5,670,864 A | * | 9/1997 | Marx | G05F 1/70 323/210 |
| 6,274,851 B1 | * | 8/2001 | Mulcahy | H05B 7/148 219/501 |
| 7,142,997 B1 | * | 11/2006 | Widner | G05F 1/70 702/67 |
| 7,295,452 B1 | * | 11/2007 | Liu | H02M 1/4225 323/284 |
| 7,688,042 B2 | * | 3/2010 | Wong | G05F 1/70 323/209 |
| 7,990,668 B2 | * | 8/2011 | Day | H02H 7/06 361/65 |
| 8,164,314 B2 | * | 4/2012 | Bremer | H02J 3/1828 323/210 |
| 8,373,394 B1 | * | 2/2013 | Huta | G05F 1/70 323/299 |
| 8,773,100 B2 | * | 7/2014 | Akahane | H02M 3/158 323/284 |
| 9,413,225 B2 | * | 8/2016 | Castelli | H02M 1/4208 |

(Continued)

*Primary Examiner* — Linh V Nguyen
(74) *Attorney, Agent, or Firm* — James M. Kasischke; Michael P. Stanley

(57) ABSTRACT

A phase correction apparatus includes an inductor joined to a series capacitor to produce phase-corrected output having a load voltage and a load current. A phase detector is joined to the series capacitor and has a phase angle output proportional to a phase angle between the voltage and current. Logic circuitry or a processor is joined to receive the phase angle output and provide switch control value outputs to switches connected to the logic circuitry. A bank of parallel capacitors are joined to the switches. The switch control value outputs activate joined parallel capacitors to adjust reactance provided to the phase-corrected output to produce an adjusted output. In a further embodiment parallel capacitors are iterated to produce the adjusted output.

9 Claims, 4 Drawing Sheets

(56) References Cited

U.S. PATENT DOCUMENTS 9,470,727 B2 * 10/2016 Voisine .................. G01R 33/02
9,639,104 B2 *  5/2017 Divan ....................... G05F 1/70

* cited by examiner

OPTIMIZED, AUTOMATIC IMPEDANCE-MATCHING SYSTEM

STATEMENT OF GOVERNMENT INTEREST

The embodiments of the invention described herein were made in the performance of official duties by employees of the U.S. Department of the Navy and may be manufactured, used, or licensed by or for the Government of the United States for any governmental purpose without payment of any royalties thereon.

CROSS REFERENCE TO OTHER PATENT APPLICATIONS

None.

BACKGROUND OF THE INVENTION

(1) Field of the Invention

The present invention is directed to an optimized, automatic impedance-matching system.

(2) Description of the Related Art

For normal underwater tracking applications, a useful device is an electronic transducer that transmits sound into the undersea environment. Those devices that transmit, rather than receive, are called acoustic projectors.

Acoustic projectors may be represented by an equivalent circuit. The circuit is highly frequency-dependent; for example, at 13 kHz the projector "looks like" an inductor in series with a resistor, because of its positive net phase angle. At 17 kHz, it is modeled instead by a series resistor and capacitor. At this frequency it has a capacitive phase angle of −42 degrees. In most cases, the equivalent circuit has a net negative phase angle. Because of this reactance, there is a requirement for a tuning component that tunes (cancels) out the reactance, leaving as close to a real, non-reactive part remaining as possible in the load impedance.

If the net phase angle is negative at the operating frequency, an inductor with reactance $j\omega L$ may be used in series to tune out the capacitive reactance $1/j\omega C$, leaving only the real (resistive) part. The better the matching, the smaller the phase angle for the combined load impedance at the load terminals. This allows the projector to deliver the highest power signal possible to the water environment. It also means that the load current and load voltage are in phase.

When tracking underwater vehicles on a range, the vehicles are prepped with a sonar generator, such as an acoustic transducer or pinger that transmits a coded signal, allowing the instrumented range to know the vehicle position at all times. Another type of pinger is used on ships or vehicles. A typical pinger puts out an acoustic power of about 150 watts. It uses a transducer, and depending on the operating frequency, typically has a matching unit that contains a high-power inductor or coil to tune out the capacitive reactance of the transducer. In practice, over the large range of operating frequencies (up to 100 kHz) a sizable spread of inductor values is needed for impedance-matching. These inductors may have thousands of volts across them in the circuit and often must tolerate currents in excess of 1 ampere to drive the transducer at 150 watts. This usually mandates custom-made inductors, built in the past by small companies. Designing high-powered magnetic components is becoming more unusual. There are few companies possessing the high-voltage testing capability in order to qualify a design for a pinger matching inductor. Tapped inductors featuring several different inductances are even more complicated and expensive to build.

SUMMARY OF THE INVENTION

In exemplary embodiments herein a phase correction apparatus includes an inductor producing inductor output having a load voltage and load current. At least one series capacitor is connected to the inductor. The series capacitor receives the inductor output and alters this output to a phase-corrected output by adding negative reactance to the inductor output. A phase detector is joined to receive the phase-corrected output to determine a phase angle between the phase-corrected load voltage and load current. Switches are connected between the phase detector and parallel capacitors. The parallel capacitors add or subtract capacitance to the phase corrected output to produce adjusted output. Connecting more of the parallel capacitors adds less of the additional negative reactance to the phase-corrected output. (A higher capacitance has less capacitive reactance.) The switches are set according to the phase angle. In an exemplary embodiment, the phase detector can be switched into the circuit in a low power mode and switched out of the circuit in a high power mode.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

As noted above, few companies possess the high-voltage testing capability in order to qualify a design for a pinger matching inductor. In view of the foregoing, a system is presented for multiple transducer types that switches in the correct components for tuning (depending on the frequency) and that utilize as few custom inductor values as possible. These apparatuses measure the phase of the load current and voltage, see how far out of phase they are, then automatically adjust the circuit to lower the phase angle to a value approaching that of a resistive load.

Therefore, an electronic circuit is provided which switches in correct tuning components to a high-power, reactive-load transducer, measures the phase difference between the load current and voltage waveforms at low power, fine tunes the matching circuit if necessary to obtain an even better impedance match, as measured by a lower phase angle, then disengages the phase detector circuitry and switches back to high power with the correct matching components in place.

Figure 1:
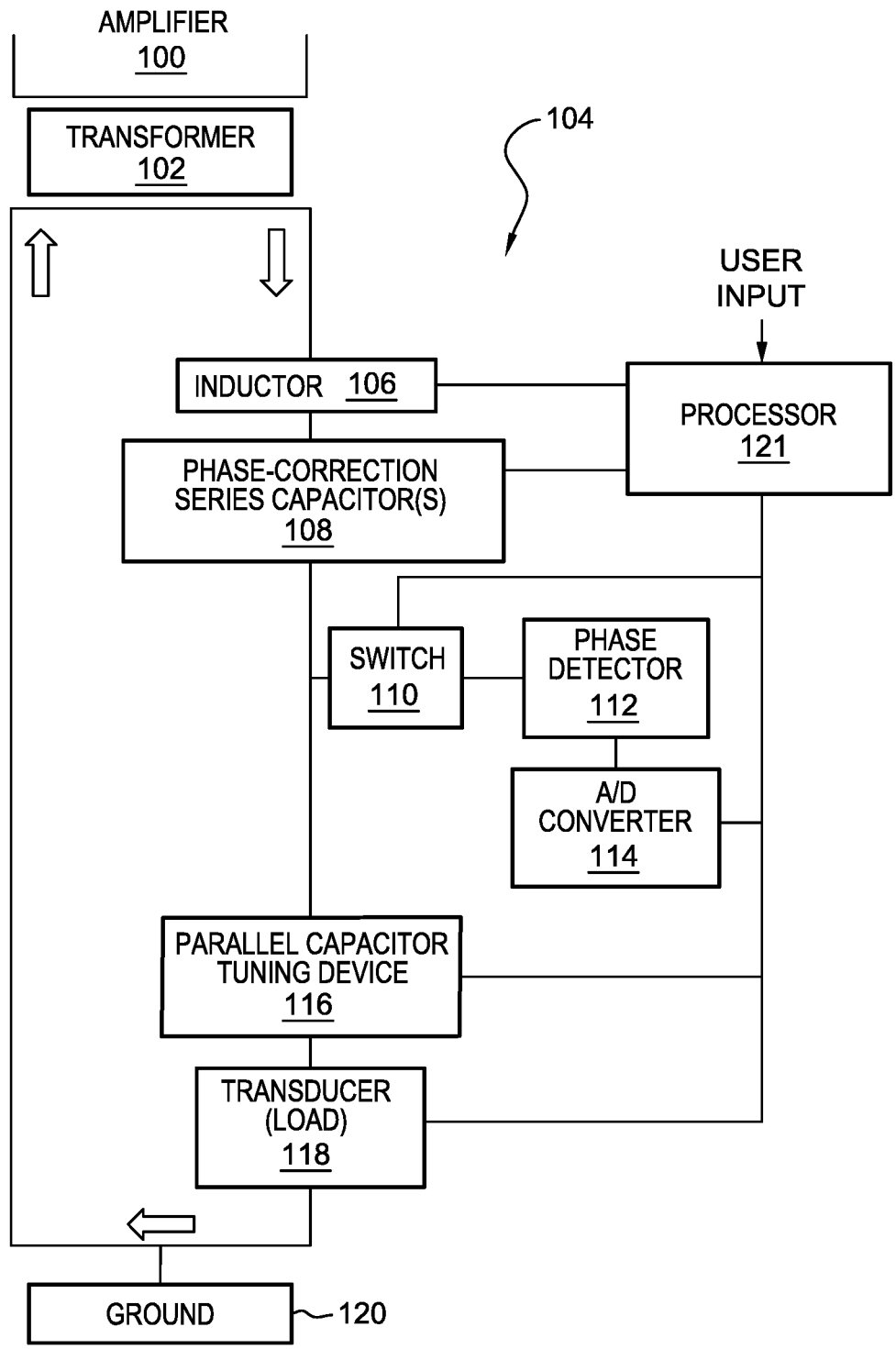
FIG. 1 is a diagram illustrating a circuit for reducing or eliminating phase angle.

FIG. 1 illustrates one embodiment of the invention including components which can be arranged in many ways using various diverse components (whether conventionally known or developed in the future) to achieve the functionality described herein. Specifically, FIG. 1 shows that apparatuses herein include any form of amplifier 100 and transformer 102. In circuit 104 shown in FIG. 1, an inductor 106 is connected to a circuit 104, at least one phase-correction series capacitor 108 is connected to the circuit 104, and a transducer 118 (e.g., projector-type transducer) is connected to the circuit 104. The circuit is joined to a ground 120. A processor 121 is provided to obtain user input and control aspects of circuit 104. The transformer 102 supplies power to the circuit 104. Processor 121 selects inductor 106 from a plurality of inductors based upon requirements of the transducer 118 and user input. User input can include the transducer 118 type and an operating frequency or frequency range. Likewise, phase-correction series capacitor 108 is selected in conjunction with inductor 106 by processor 121. As shown in FIG. 1, the phase-correction series capacitor 108 receives inductor 106 output and alters the output to a phase-corrected output by adding negative reactance.

Additionally, a switch 110 selectably connects a phase detector 112 to the circuit 104. Processor 121 is used to control the circuit 104 between a low power mode and a high power mode by connection with switch 110 and transducer 118. Processor 121 uses the switch 110 to connect the phase detector 112 to the circuit 104 when the circuit 104 is operating at a lower power setting. The low power setting is preferably about 1-5% of the high power setting.

The phase detector 112 outputs a phase angle to an analog/digital (A/D) converter 114, which supplies a digitized phase angle. Logic circuitry or a processor 121 receives the digitized phase angle and can provide control signals to a parallel capacitor tuning device 116. The parallel capacitor tuning device 116 utilizes a relay bank to select capacitance to reduce or eliminate the phase angle. This improves the operation of the transducer (load) 118 which can now operate with little or no phase angle (e.g., an impedance magnitude equal to the real part of the transducer).

Figure 2:
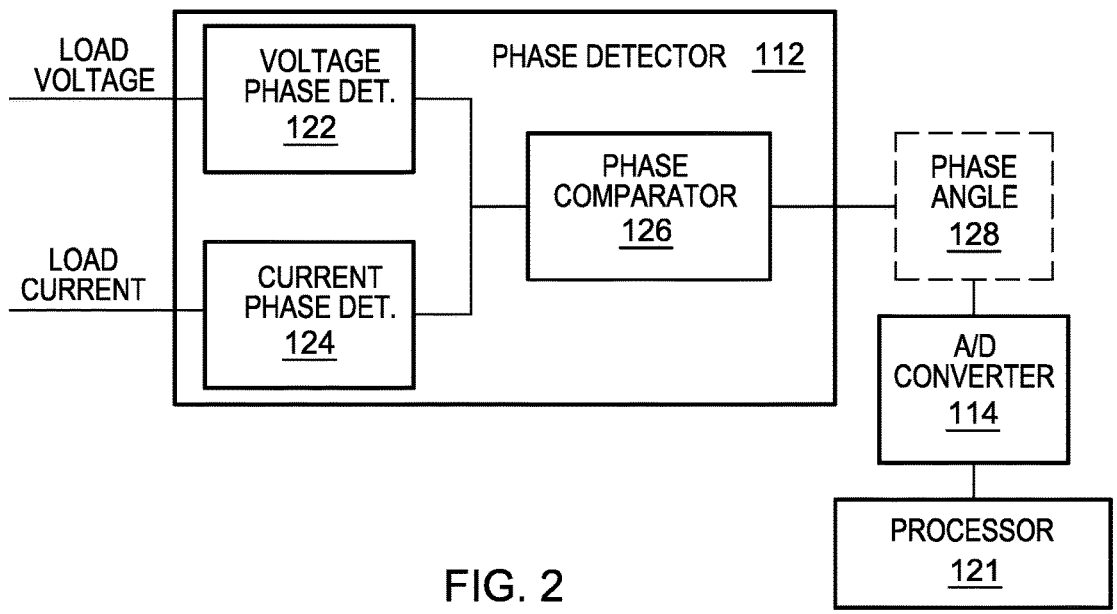
FIG. 2 is a diagram illustrating operations of the phase detector.

FIG. 2 illustrates the phase detector 112. As shown in FIG. 2, the phase detector 112 uses a voltage phase detector 122 and a current phase detector 124 in combination with a phase comparator 126 to determine the phase angle 128 between load voltage and load current of the phase-corrected output. Specifically, the phase comparator 126 compares the phase detected by the voltage phase detector 122 with the phase detected by the current phase detector 124 to find the phase angle between the two phases. The phase angle 128 can be received by analog to digital convertor 114 for conversion into a digitized phase angle 129. (Analog to digital convertor 114 is necessary because phase angle 128 is provided as an analog voltage output. In an embodiment using a digital phase detector, this may not be necessary.) Digitized phase angle 129 is provided to processor 121.

Figure 3:
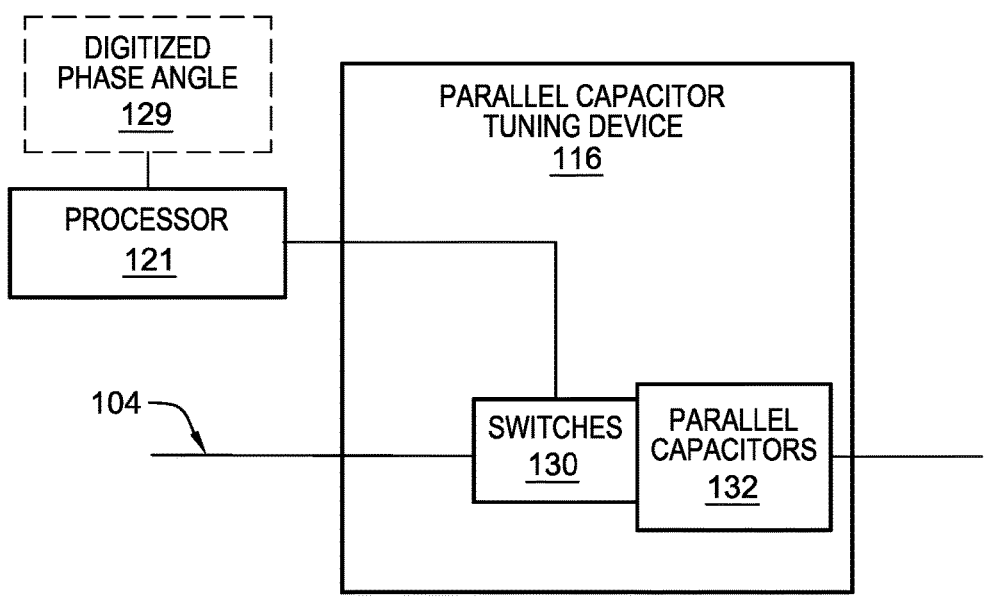
FIG. 3 is a diagram providing an overview of the parallel capacitor tuning device.

FIG. 3 illustrates the parallel capacitor tuning device 116. As can be seen in FIG. 3, switches 130 are connected to the circuit 104 and to the analog to digital converter 114 and parallel capacitors 132 are connected to the circuit 104 through the switches 130. The switches 130 are activated and deactivated according to processor 121 in accordance with the digitized phase angle 129. (In an alternative embodiment logic circuitry, could be utilized in place of processor 121.) More specifically switches 130 are made from a relay bank having a plurality of switches 130. Each switch 130 is joined to receive a digital output bit from processor 121. Each switch 130 is further joined to a capacitance circuit of the parallel capacitors 132 having a value corresponding to the significance of the associated digital bit. As the digitized phase angle 129 increases, switches 130 activate the appropriate capacitance circuits to add additional negative reactance to the phase-corrected output, so as to produce adjusted output.

Connecting more of the parallel capacitors 132 adds more capacitance, decreases the capacitive reactance, and thus decreases the negative phase angle. The transducer 118 shown in FIG. 1 operates using the adjusted output from the parallel capacitor tuning device 116. The switches 130 are set to reduce the phase angle considering the load exerted by the transducer 118 on the circuit 104.

The foregoing apparatus is very useful if the required inductor has a non-standard value because a larger, standard value inductor 106 may be used and the series capacitor 108 may be added to subtract the required inductive reactance out and "down-tune" it to the correct value. Thus, for practicality the series capacitor 108 is shown in FIG. 1 to allow adjustment of the inductor 106, with the possibility of adding (or subtracting) additional capacitors in parallel (using the parallel capacitor tuning device 116) or series capacitor 108 to fine-tune it even further in pursuit of a zero overall phase angle. In one example, if the phase angle of the transducer is (arctan (X/R)), with X being the reactance and R being the real part, it can be seen that the smaller the real part the better the matching is required (lower reactance needed) to achieve a given phase angle.

This is very useful because it is generally much easier to find high-voltage capacitors with convenient selections of capacitance than it is to obtain odd-value, high power inductors. The alternating current (AC) rating of capacitors is much lower than the direct current (DC) rating, on the order of one-third. Special high-voltage capacitors with AC specifications and the correct dielectric material can be used with embodiments of the invention.

Further the embodiments of the invention are optimized to match a large number of transducer/frequency combinations with a single configuration. Load circuit analysis software in processor 121 calculates the impedance magnitude and phase of the circuit looking into the load. The correct tuning components are calculated using this process which can result in an essentially zero phase angle at the load terminals, with an impedance magnitude equal to the real part of the transducer. That is because the inductive and capacitive reactance cancel each other out. This software program may be furnished upon request.

The phase detector 112 described above allows a true phase measurement between the load voltage and current waveforms. In one example, a perfect phase match between the two inputs gives an output of 1.8 volts; a non-zero phase difference gives a voltage between 0 and 1.8 v. The inputs can be, for example, driven between 200 and 800 millivolts.

Figure 5:
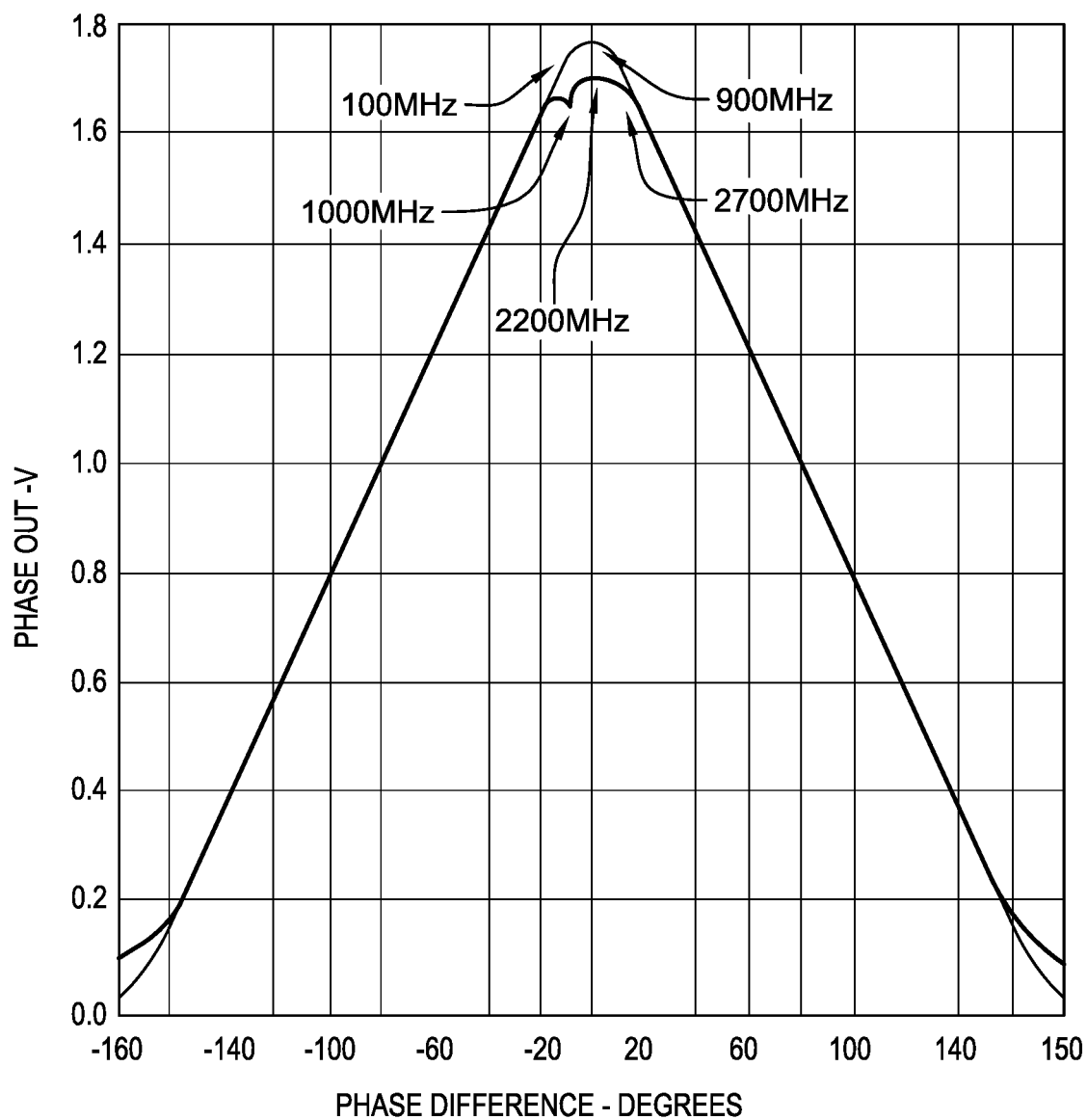
FIG. 5 is a diagram illustrating detector transfer function.

FIG. 5 illustrates the transfer function (voltage output vs. phase difference input) of a typical phase comparator. As one transits right on the x axis in FIG. 5, the phase becomes more positive (more inductive) and on the left-hand side, more negative (i.e., capacitive). Using this example, if a phase measurement is taken and the output is 1.5 volts, there is an ambiguity as to which side of the curve the measurement represents.

However, only one more data point is needed to resolve this. Therefore, the parallel capacitor tuning device 116 is used to add capacitive reactance to the circuit to see if voltage increases or decreases. If the output voltage increases, this means the original data point was inductive (right hand part of the curve in FIG. 5) because now the negative phase of the added capacitance is moving the detector up towards 1.8 volts. In contrast, if adding capacitive reactance to the load circuit the parallel capacitor tuning device 116 reduces the detector output voltage in the next measurement, then the phase was negative (capacitive) to begin with (left-hand side of the function in FIG. 5) and is continuing to become more negative.

Thus, by reading the phase detector 112 output after adding a parallel capacitor 132 in the parallel capacitor tuning device 116, the apparatus shown in FIG. 1 can automatically evaluate the matching process and stop when the phase of the load current approaches 0 degrees. The parallel capacitors 132 are selected so that the tuning steps are small enough to avoid very large "jumps" in the phase response as the matching process occurs. In one example, a target tuning increment of 5 degrees per step can be used.

The foregoing shows that there are two sections to the impedance matching system: the phase detector 112 with its signal conditioning, and parallel capacitor tuning device 116 with the tuning capacitors 132 and switches 130 to switch in the correct reactance.

Figure 4:
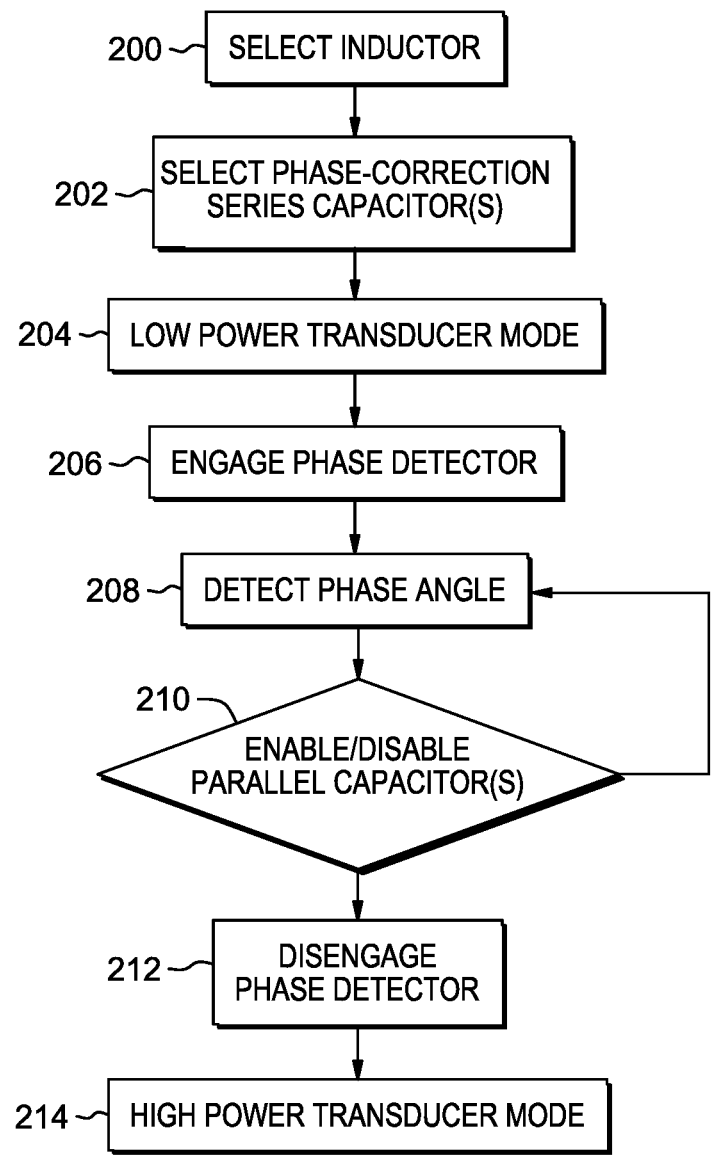
FIG. 4 is a flowchart showing processing.

FIG. 4 shows operation of the foregoing devices in flowchart form. In item 200 in FIG. 4 one of many possible inductors or inductor combinations is selected (e.g., using relays). This allows a standard large inductor that does not need custom sizing to be utilized, with subsequent phase-correction using capacitors. In item 202, the one or more series-connected capacitors is selected to perform the first and larger amount of phase-correction which adds negative reactance. Generally, the phase-correction processes herein add negative reactance (cancels out the reactance) to leave as close to a real, non-reactive part remaining as possible in the load impedance for the transducer.

Thus, in item 200, processor 121 decodes a lookup table to determine which inductor to select when the user specifies the transducer and operating frequency via a touch-screen or switch closure. In one example, if a given transducer is selected for a K-frequency exercise, a 4 mH inductor may be selected and phase-corrected to 3.84 mH with a 0.93 uF series capacitor as a starting point. Thus, the lookup table provides the correct bit pattern that selects the appropriate inductor. The adjacent, series "phase-correction" capacitor is selected along with it in item 202.

In item 204, processor 121 sets the transducer to operate in a relatively low power mode. In item 206, the second switch is turned on to engage the phase detector. Therefore, as shown above, the transducer (pinger) is put into low-power mode. This ensures that the phase detector (which usually has very low voltage/amperage limits) is not damaged.

In item 208, the phase detector detects the phase angle. In item 210, the phase angle is used to set the switches that control the parallel capacitors. Processing loops back to item 208 until the phase angle is reduced to zero or at least below an established upper limit. Thus, in items 208 and 210 some of the parallel capacitors are connected to the circuit and then the phase angle is measured again. Parallel capacitor connections (capacitor engagement/disengagements) that decrease phase angle are repeated and connections that increase phase angle are reversed. This processing is repeated until no more decreases in phase angle occur or until the phase angle is below an upper limit (or is at zero).

In other words, in items 208 and 210, relays enabling the two phase detector signals are turned on, and a phase angle reading is obtained. If the voltage reading indicates a phase difference of 10 degrees or less then the process stops and the tuning relays hold the correct inductor and capacitors in place. Processor 121 can be programmed by user input to allow coarser or finer phase angle tolerances.

Once this loop processing is finished, in item 212 the phase detector is disconnected from the circuit. Then, in item 214, the transducer is returned to high power operation. (High power operation is that which allows the transducer to transmit or project a signal.) The pinger reverts to high power signal transmission using the selected tuning relay values for the capacitor bank. The measured phase angle of the load current is optionally displayed via an LCD or other display device if desired.

Thus, as shown above, if the phase angle is out of specification then tuning step capacitors may be selected to add or subtract from the present phase angle to get it closer to zero degrees. For fine-tuning, only parallel capacitors in the parallel capacitor tuning device are used. These are in parallel with the initial phase-correction capacitor. The reason for this is that, for small increments of capacitive reactance tuning (i.e., very large capacitor value), series capacitors would be prohibitively large in size. Capacitor step sizes were worked out beforehand to give, for example, approximately a +/−5 degree phase change. By starting at, say, 0.7 of the "phase-correction" value, the step capacitors may be selected to "ramp up" the total parallel value of capacitance until a better or near-zero phase match is obtained.

Increasing the capacitance by switching in parallel capacitors, lowers the capacitive reactance and thus the negative phase angle, resulting in a more positive total (composite) phase angle when added with the phase of the inductor. Note: a purely resistive load connected across the transducer terminal pads at the relay board output, should give a load voltage and current in phase, a convenient crosscheck. With these conditions the phase detector output should read 1.8 volts in this example.

The impedance matching system described herein utilizes a phase detector for maximum accuracy. High-end automatic antenna tuners for radio-frequency utilize phase detectors. The selection of tuning components is performed automatically, rather than manually. These devices/methods use inexpensive, off-the-shelf components to avoid custom, expensive procurements, especially for odd-valued inductors. The circuit avoids tapped inductors by phase-correcting the initial, standard value inductor with off-the-shelf, high-voltage capacitors in series with the inductor.

The suite of available tuning circuit components has been optimized with a sorting routine (a macro with multiple nested sorting loops) to provide the most efficient component combinations. This results in more efficient tuning steps and component selection given a finite amount of board space for high-voltage components. Maximum tuning flexibility is achieved with the fewest number of large, high-voltage components possible. Thus, multiple transducers may be tuned and matched with one circuit board. The number of unique-valued inductors has been minimized using a phase-correction technique starting with the maximum-valued inductor necessary for a given group of transducers.

Instead of using separate current and voltage monitor transformers, that measure the voltage phase at the transformer primary, the devices and methods herein allows a true phase measurement of the actual load current by reducing the waveform power before the phase measurement, measuring the actual load phase, fine-tuning the load as appropriate, and then disconnecting the phase detector before transmitting at full power. Added phase errors resulting from add-on current and voltage transformers are thus avoided.

If the list of required transducers is reduced, that would leave room on the relay board for more tuning capacitors for finer step sizes. An option in the tuning could stop fine-tuning after three tuning attempts, for example, choosing the best set of matching components and displaying the final load phase. Depending on the available space in the enclosure and the board dimensions, this matching system is expandable to other transformers and inductors as well. That is why, in the final implementation of this system, the transformer and inductors were mounted off-board.

The invention has been described with references to specific embodiments. While particular values, relationships, materials, and steps have been set forth for purposes of describing concepts of the present disclosure, it will be appreciated by persons skilled in the art that numerous variations and/or modifications may be made to the invention as shown in the disclosed embodiments without departing from the spirit or scope of the basic concepts and operating principles of the invention as broadly described. It should be recognized that, in the light of the above teachings, those skilled in the art could modify those specifics without departing from the invention taught herein. Having now fully set forth certain embodiments and modifications of the concept underlying the present disclosure, various other embodiments as well as potential variations and modifications of the embodiments shown and described herein will obviously occur to those skilled in the art upon becoming familiar with such underlying concept. It is intended to include all such modifications, alternatives, and other embodiments insofar as they come within the scope of the appended claims or equivalents thereof. It should be understood, therefore, that the invention might be practiced otherwise than as specifically set forth herein. Consequently, the present embodiments are to be considered in all respects as illustrative and not restrictive.

Finally, any numerical parameters set forth in the specification and attached claims are approximations (for example, by using the term "about") that may vary depending upon the desired properties sought to be obtained by the present disclosure. At the very least, and not as an attempt to limit the application of the doctrine of equivalents to the scope of the claims, each numerical parameter should at least be construed in light of the number of significant digits and by applying ordinary rounding.

What is claimed is:

1. A phase correction apparatus for a load comprising:
   a phase detector joined to the load and having a phase angle output proportional to a phase angle between a load voltage and a load current;
   logic circuitry joined to receive the phase angle output and having switch control value outputs;
   switches connected to said logic circuitry, said switches being responsive to the switch control value outputs; and
   parallel capacitors connected to said switches, wherein switch control value outputs activate joined parallel capacitors to adjust reactance provided to the phase-corrected output to produce adjusted output;
   an inductor having an inductor output joined to the load; and
   at least one series capacitor connected to said inductor, wherein said series capacitor receives said inductor output and adds negative reactance to the inductor output to produce phase-corrected output having a load voltage and a load current;
   said phase detector being joined to said at least one series capacitor to receive phase-corrected output.

2. The apparatus of claim 1, further comprising an analog to digital convertor joined to said phase detector to receive the phase angle output, said analog to digital convertor providing digital phase angle outputs wherein said logic circuitry is joined to receive the digital phase angle outputs and to provide switch control value outputs.

3. The apparatus of claim 2, further comprising a processor joined to receive the digital phase angle output and implementing said logic circuitry by instructions programmed therein to provide switch control value outputs.

4. A phase corrected apparatus for joining between an amplifier and a selected high impedance load having a low power mode and a high power mode comprising:
   an inductor joinable to the amplifier having an inductor output, said inductor inductance being selected to offset reactance from the selected high impedance load;
   at least one series capacitor connected to said inductor, wherein said series capacitor receives said inductor output and adds negative reactance to the inductor output to produce phase-corrected output having a load voltage and a load current;
   a phase detector switch joined to the series capacitor to receive the phase-corrected output, said phase detector switch being activated in the low power mode and deactivated in the high power mode;
   a phase detector joined to the phase detector switch and having a phase angle output proportional to a phase angle between the load voltage and the load current of said phase-corrected output;
   logic circuitry joined to receive the phase angle output and having parallel capacitor switch control value outputs;
   parallel capacitor switches connected to said logic circuitry, said parallel capacitor switches being responsive to the parallel capacitor switch control value outputs in low power mode, and said parallel capacitor switch settings being maintained in high power mode; and
   parallel capacitors connected to said parallel capacitor switches, wherein parallel capacitor switches control parallel capacitors to adjust reactance provided to the phase-corrected output to produce adjusted output.

5. The apparatus of claim 4, further comprising an analog to digital convertor joined to said phase detector to receive the phase angle output, said analog to digital convertor providing digital phase angle output wherein said logic circuitry is joined to receive the digital phase angle output and to provide parallel capacitor switch control value outputs.

6. The apparatus of claim 5, further comprising a processor joined to receive the digital phase angle output and implementing said logic circuitry by instructions programmed in said processor to provide parallel capacitor switch control value outputs.

7. The apparatus of claim 6, wherein:
   said inductor is a selectable bank of inductors joined to said processor;
   said at least one series capacitor is a selectable bank of series capacitors joined to said processor; and
   said processor receives user input indicating the high impedance load, is programmed to select said inductor from the selectable bank of inductors based on the selected high impedance load, and is programmed to select said at least one series capacitor from the selectable bank of series capacitors based on the selected high impedance load.

8. The apparatus of claim 7, wherein said processor is joined to said phase power switch and is programmed to iteratively select parallel capacitor switch control value outputs in low power mode until the digital phase angle output is within a preprogrammed tolerance value and to deactivate said phase power switch in high power mode.

9. The apparatus of claim 6, wherein said processor is joined to said phase power switch and is programmed to iteratively select parallel capacitor switch control value outputs in low power mode until the digital phase angle output is within a preprogrammed tolerance value and to deactivate said phase power switch in high power mode.

\* \* \* \* \*